(12) United States Patent
Yang et al.

(10) Patent No.: US 7,146,106 B2
(45) Date of Patent: Dec. 5, 2006

(54) OPTIC SEMICONDUCTOR MODULE AND MANUFACTURING METHOD

(75) Inventors: Jun Young Yang, Seoul (KR); Sang Ho Lee, Seoul (KR); Chul Woo Park, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 660 days.

(21) Appl. No.: 10/227,051

(22) Filed: Aug. 23, 2002

(65) Prior Publication Data

US 2004/0036135 A1   Feb. 26, 2004

(51) Int. Cl.
*H04B 17/00* (2006.01)

(52) U.S. Cl. ............... 398/138; 398/163; 398/164; 385/14; 385/37

(58) Field of Classification Search ........... 398/138, 398/163–164; 385/14, 37, 49
See application file for complete search history.

(56) References Cited

U.S. PATENT DOCUMENTS

| | | | |
|---|---|---|---|
| 3,880,528 A | 4/1975 | Petersen et al. ............ 356/225 |
| 4,055,761 A | 10/1977 | Shimomura ................ 250/239 |
| 4,491,865 A | 1/1985 | Danna et al. ................ 358/98 |
| 4,896,217 A | 1/1990 | Miyazawa et al. ..... 358/213.11 |
| 4,999,142 A | 3/1991 | Fukushima et al. .......... 264/1.7 |
| 5,023,442 A | 6/1991 | Taniguchi et al. ....... 250/208.1 |
| 5,068,713 A | 11/1991 | Toda ............................ 357/72 |
| 5,122,861 A | 6/1992 | Tamura et al. ................ 357/74 |
| 5,220,198 A | 6/1993 | Tsuji .......................... 257/731 |
| 5,274,456 A | 12/1993 | Izumi et al. ................. 358/209 |
| 5,365,101 A | 11/1994 | Tonai .......................... 257/434 |
| 5,383,034 A | 1/1995 | Imamura et al. ............ 358/474 |
| 5,400,072 A | 3/1995 | Izumi et al. ................ 348/335 |
| 5,412,229 A | 5/1995 | Kuhara et al. .............. 257/183 |
| 5,434,682 A | 7/1995 | Imamura et al. ............ 358/474 |
| 5,436,492 A | 7/1995 | Yamanaka .................. 257/433 |
| 5,444,520 A | 8/1995 | Murano ...................... 355/229 |
| 5,463,229 A | 10/1995 | Takase et al. ................ 257/59 |
| 5,479,540 A * | 12/1995 | Boudreau et al. ............ 385/14 |
| 5,489,995 A | 2/1996 | Iso et al. .................... 358/483 |
| 5,523,608 A | 6/1996 | Kitaoka et al. ............. 257/433 |
| 5,570,204 A | 10/1996 | Kumashiro ................. 358/471 |
| 5,581,094 A | 12/1996 | Hara et al. .................... 257/80 |
| 5,604,362 A | 2/1997 | Jedlicka et al. ............. 257/233 |
| 5,617,131 A | 4/1997 | Murano et al. ............. 347/233 |
| 5,655,189 A | 8/1997 | Murano ...................... 399/220 |
| 5,672,902 A | 9/1997 | Hatanaka et al. ........... 257/431 |

(Continued)

FOREIGN PATENT DOCUMENTS

GB           1022329           7/1964

(Continued)

*Primary Examiner*—Dzung D. Tran
(74) *Attorney, Agent, or Firm*—Gunnison, McKay & Hodgson, L.L.P.; Serge J. Hodgson

(57) ABSTRACT

An optic semiconductor package includes a main board of a substantially planar plate shape. The main board includes an aperture therethrough and a plurality of board metal patterns formed at the periphery of the aperture. A package portion is coupled to the main board. The package portion includes a base, a laser diode and a photo detector electrically coupled to the board metal patterns of the main board and bonded to the base. An optical fiber is inserted into the aperture of the main board and disposed adjacent the package portion. The position and tilt of the optical fiber may be adjusted to achieve optimum optical coupling between the optical fiber and the laser diode and the optical fiber and the photo detector. The optical fiber is stably attached to the main board by an adhesive.

17 Claims, 9 Drawing Sheets

U.S. PATENT DOCUMENTS

| | | | |
|---|---|---|---|
| 5,783,815 A | 7/1998 | Ikeda | 250/208.1 |
| 5,804,827 A | 9/1998 | Akagawa et al. | 250/370.06 |
| 5,811,799 A | 9/1998 | Wu | 250/239 |
| 5,821,532 A | 10/1998 | Beaman et al. | 250/239 |
| 5,825,560 A | 10/1998 | Ogura et al. | 359/822 |
| 5,861,654 A | 1/1999 | Johnson | 257/433 |
| 5,902,993 A | 5/1999 | Okushiba et al. | 250/208.1 |
| 5,932,875 A | 8/1999 | Chung et al. | 250/239 |
| 5,998,878 A | 12/1999 | Johnson | 257/797 |
| 6,011,294 A | 1/2000 | Wetzel | 257/434 |
| 6,011,661 A | 1/2000 | Weng | 359/819 |
| 6,020,582 A | 2/2000 | Bawolek et al. | 250/208.1 |
| 6,037,655 A | 3/2000 | Philbrick et al. | 257/680 |
| 6,060,722 A | 5/2000 | Havens et al. | 250/566 |
| 6,072,232 A | 6/2000 | Li et al. | 257/680 |
| 6,122,009 A | 9/2000 | Ueda | 348/335 |
| 6,130,448 A | 10/2000 | Bauer et al. | 257/222 |
| 6,147,389 A | 11/2000 | Stern et al. | 257/434 |
| 6,153,927 A | 11/2000 | Raj et al. | 257/680 |
| 6,184,514 B1 | 2/2001 | Rezende et al. | 250/208.1 |
| 6,384,397 B1 | 5/2002 | Takiar et al. | 250/208.1 |
| 6,384,472 B1 | 5/2002 | Huang | 257/680 |
| 6,392,703 B1 | 5/2002 | Uchino et al. | 348/373 |
| 6,498,624 B1 | 12/2002 | Ogura et al. | 348/335 |
| 6,518,656 B1 | 2/2003 | Nakayama et al. | 257/680 |
| 6,627,864 B1 | 9/2003 | Glenn et al. | 250/208.1 |
| 6,627,872 B1 | 9/2003 | FuKamura et al. | 250/239 |
| 6,695,492 B1 * | 2/2004 | Ide et al. | 385/88 |
| 6,762,796 B1 | 7/2004 | Nakajoh et al. | 348/340 |
| 6,767,753 B1 | 7/2004 | Huang | 438/25 |
| 6,867,438 B1 | 3/2005 | Maruyama et al. | 257/184 |
| 2002/0033979 A1 * | 3/2002 | Dair et al. | 359/152 |
| 2002/0033980 A1 * | 3/2002 | Lo | 359/152 |
| 2002/0051268 A1 * | 5/2002 | Tonehira et al. | 359/152 |
| 2003/0137595 A1 | 7/2003 | Takachi | 348/340 |

FOREIGN PATENT DOCUMENTS

| | | |
|---|---|---|
| GB | 2 146 504 | 4/1985 |
| JP | 59-228755 | 12/1984 |
| JP | 62-224047 | 10/1987 |
| JP | 09-021938 | 1/1997 |
| JP | 09-232548 | 9/1997 |
| JP | 10-302587 | 11/1998 |
| WO | WO 93/22787 | 11/1993 |
| WO | WO 00/038103 | 6/2000 |
| WO | WO 03/019660 | 3/2003 |

* cited by examiner

OPTIC SEMICONDUCTOR MODULE AND MANUFACTURING METHOD

BACKGROUND OF THE INVENTION

1. Field of the Invention

The present invention relates generally to the packaging of semiconductor devices. More particularly, the present invention relates to a reduced thickness semiconductor optical communication device package and a method of fabricating the same.

2. Description of the Related Art

In general, optical communication is a method by which information is transmitted and received by means of light.

When information is required to be transmitted, the information is first converted to an electrical signal, which is then converted again to a communication signal and then sent to a laser diode, that is, a light-emitting diode. The laser diode converts the electric communication signal to an optical signal, which is then transmitted through an optical fiber. An apparatus for converting the electric signal to the optical signal and transmitting the optical signal to the optical fiber is called a transmitter. After being outputted from the transmitter and then transmitted through the optical fiber over a long distance, an amplification circuit restores the attenuated original signal wave, which is then converted to an electric signal by a photo detector for detecting the light, that is, a light receiving element. The light receiving element, which plays the opposite role to that of the transmitter, is called a receiver.

In the light transmitter and receiver, the most important component is the optic semiconductor package, a light coupling module which converts the electric signal to the optical signal of the optical fiber and the optical signal to the electric signal. The optic semiconductor package includes optical elements, such as a laser diode and a photo detector, optical fibers, and parts for packaging the optical elements and fibers.

Two kinds of methods, active alignment and passive alignment, are generally employed in coupling the optical fiber for transmitting light with the optical elements. Presently, the optic semiconductor package employing active alignment is most utilized. In the optic semiconductor package by the active alignment, an optical element usually adheres to a substrate and the optical element and the substrate are electrically connected with each other by a conductive wire. Thereafter, a metal can, to which glass is attached, is coupled to the substrate over the optical element, and the optical fiber is adjustably fixed to the glass attached to the metal can. Thereafter, the position of the optical fiber is precisely adjusted according to the change of the electric or optical signal after the optical element is operated, and the optical fiber is completely fixed to the metal can in an optimal optical coupling state by means of laser welding, soldering, or epoxy adhesion.

In the conventional optic semiconductor package as described above, although the optical fiber and the optical element can be completely fixed in relation to each other, and, in comparison with the passive alignment method, measurements can be easily carried out, the optical fiber may be minutely tilted or the position of the optical fiber may be minutely changed in the optic semiconductor module even after the optic semiconductor module is mounted to an external device.

The tilt or the change of the position of the optical fiber means a misalignment of the optical fiber core and an optical wave-guide between the optical fiber and the optical element, which remarkably deteriorates the optical coupling efficiency. Further, in the conventional optic semiconductor package, the overall dimension of the optic semiconductor module is increased. Not only is the optical element located on the substrate on which the metal can is placed over the optical element, but also an additional long conductive pin for packaging the module to the main board has to be arranged in the module. Also, due to the large number of parts described above, the process of manufacturing the optic semiconductor module is complicated and costly.

BRIEF SUMMARY OF THE INVENTION

An optic semiconductor package includes a main board of a substantially planar plate shape. The main board includes an aperture therethrough and a plurality of board metal patterns formed at the periphery of the aperture. A package portion is coupled to the main board. The package portion includes a base, a laser diode and a photo detector electrically coupled to the board metal patterns of the main board and bonded to the base. An optical fiber is inserted into the aperture of the main board and disposed adjacent the package portion. The optical fiber is stably attached to the main board by an adhesive.

The present invention is best understood by reference to the following detailed description when read in conjunction with the accompanying drawings.

BRIEF DESCRIPTION OF THE DRAWINGS

Common reference numerals are used throughout the drawings and the detailed description to indicate like elements.

A DETAILED DESCRIPTION OF THE INVENTION

Figure 1:
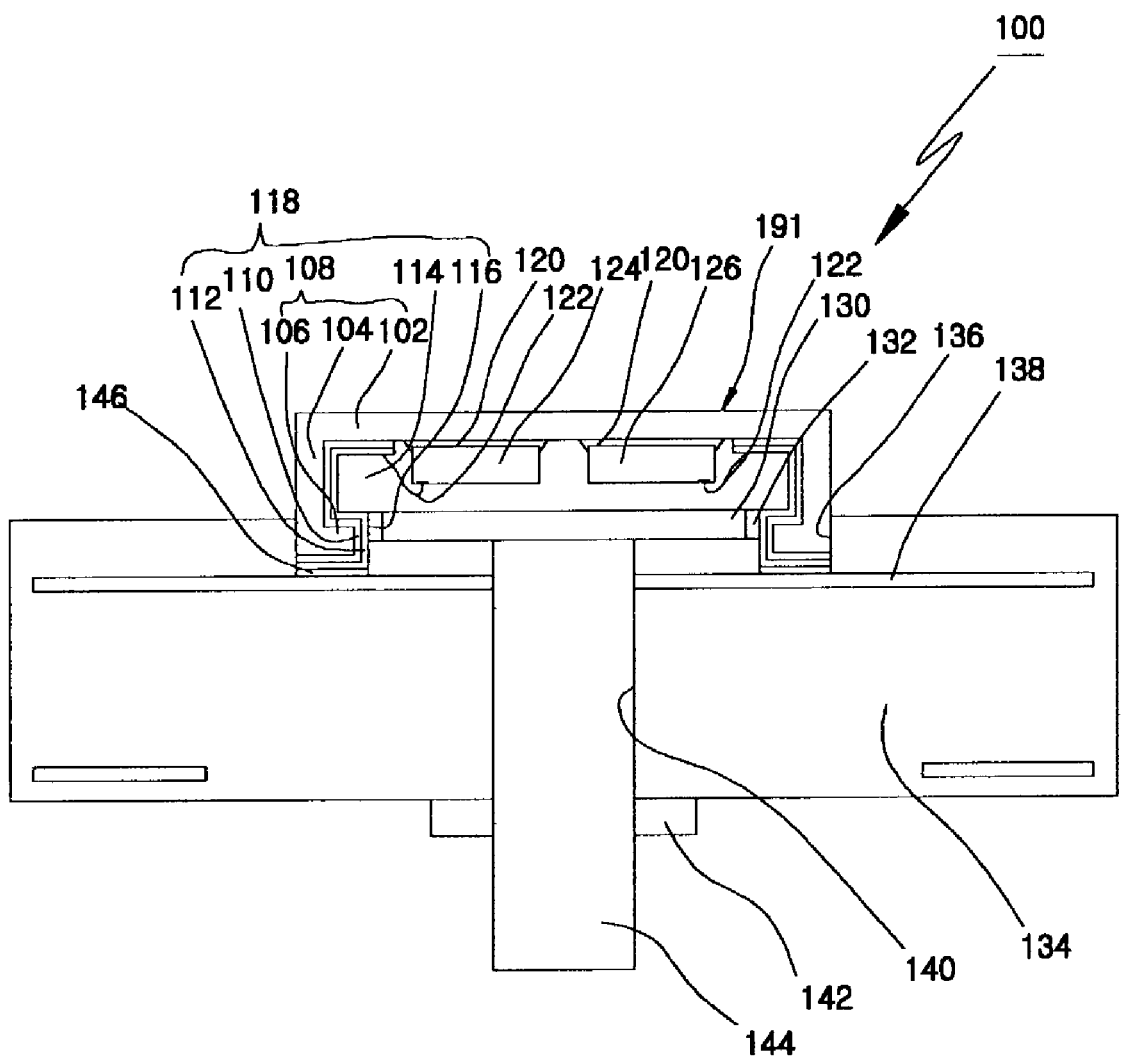
FIG. 1 is a sectional view illustrating one embodiment of the present invention.

Referring to FIG. 1, a sectional view of one embodiment of an optic semiconductor module of the present invention is illustrated. The optic semiconductor module 100 according to the present invention includes a semiconductor package portion 191, a main board 134 and an optical fiber 144 or the like.

The semiconductor package portion 191 includes: a base 108 defining a space 114 of a prescribed volume therein and defining an opening 116 of a prescribed size at the lower part of the base 108; a plurality of substrate metal patterns 112 formed on the inside surfaces and the bottom surface of the base 108; and an adhesive layer 110 between the base 108 and the metal patterns 112. Together, the base 108, the adhesive layer 110 and the substrate metal patterns 112 are defined as a cap type substrate 118.

The base 108 includes a planar portion 102, which, in one embodiment, is of an approximately planar plate shape, formed on the upper part of the base 108, a vertical bending portion 104 bent vertically downward at the edge of the planar portion 102, and a horizontal bending portion 106 of a prescribed length extending horizontally from the lower part of the vertical bending portion 104 toward the inside direction of the vertically bending portion 104. The space 114 of a prescribed volume is defined and formed by the planar portion 102, the vertical bending portion 104 and by the horizontal bending portion 106. Also, the opening 116 is defined and formed by the horizontal bending portion 106. The base 108 may be any one of a metal, ceramic, thermosetting resin or any dielectric material. The adhesive layer 110 is laminated to a part of the inside surface of the planar portion 102, the inside surface of the vertical bend portion 104, and each of the inside surfaces and the bottom surface of the horizontal bending portion 106. Also, substrate metal patterns 112 are laminated to the surface of the adhesive layer 110.

A laser diode 124 and a photo detector 126 are attached to the upper inside of the cap type substrate 118, that is, to the bottom surface of the planar portion 102, by means of an attach material 120. The laser diode 124, as is well known, serves to convert the electrical signals of the substrate metal patterns 112 into the optical signals that are to be outputted to outside through a wave-guide (not shown). The photo detector 126 serves to convert the optical signals from the outside into the electrical signals that are to be transmitted to the substrate metal patterns 112. The laser diode 124 and photo detector 126 are electrically connected to the substrate metal patterns 112 by means of a plurality of conductive wires 122. The material of the conductive wires may be any conductive material such as aluminum (Al), gold (Au), copper (Cu) or its equivalent. Accordingly, the laser diode 124 and photo detector 126 can be electrically connected to the substrate metal patterns 112

A glass 130, positioned within the opening 116 of the cap type substrate 118, is attached to an end portion of the horizontal bending portion 106 by means of a glass attach material 132 interposed between a perimeter edge of the opening and perimeter edge of the glass, thus sealing space 114 from the outside environment. In an alternative embodiment, a lens having a predetermined focus can be used as an alternative of the glass 130. A vacuum is formed in the space 114 of the cap type substrate 118 in order to minimize the refractive index within the space 114.

The main board 134, which, in one embodiment, is formed in an approximately planar plate shape includes: an aperture 140 approximately at the center of the main board 134; a plurality of board metal patterns 138 formed at the periphery of the aperture 140 and used to electrically connect the main board 134 to the metal patterns 112 of the cap type substrate 118; and a depression portion 136 at the periphery of the aperture 140 extending into the main board 134 a predetermined depth from the top surface of the main board 134. The depression portion 136 and the aperture are in optical communication.

The package portion 191 is coupled to the depression portion 136 and the substrate metal patterns 112 of the substrate 118 are electrically connected to the board metal patterns 138 of the main board 134. A connector 146 used for connecting the substrate metal patterns 112 to the board metal patterns 138 may be any one of conductive material such as gold (Au), silver (Ag), solder (Sn/Pb) or its equivalent. In an alternative embodiment of the present invention, the depression portion 136 having a predetermined depth may not be formed and aperture 140 extends entirely through main board 134. However, if the depression portion 136 is formed, it allows the thickness of the entire package to be decreased.

The optical fiber 144 is coupled to the aperture 140 of the main board 134 and the upper part of the optical fiber 144 is positioned adjacent to the glass, thereby receiving photo signals from the laser diode 124 and transmitting photo signals to the photo detector 126. In one embodiment, the aperture 140 of the main board 134 is arranged in a straight line from the depression portion 136, or from the top surface of main board 134 if the depression portion 136 is not included, to the bottom surface of main board 134. A fixer 142 can be coupled to the main board 134 at the end of the aperture 140 located at the bottom surface of the main board 134 in order to fix the optical fiber 144 to the main board 134.

Figure 2:
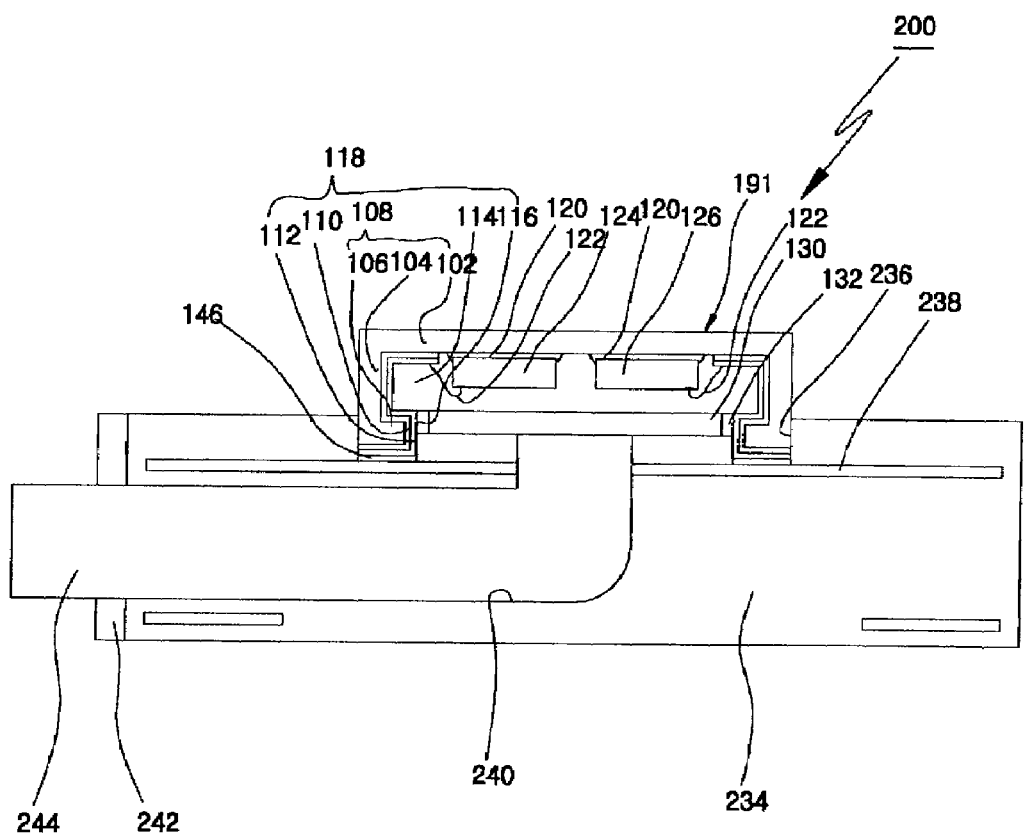
FIG. 2 is a sectional view illustrating another embodiment of the present invention.

Referring to FIG. 2, a sectional view of another embodiment of an optic semiconductor module of the present invention is illustrated. An aperture 240 of a main board 234 bends between a depression portion 236 and a side surface of main board 134. A fixer 242 can be further attached to the main board 234 at the end of the aperture 240 located at the side surface of the main board 234 in order to fix an optical fiber 244 to the main board 234. The optical fiber 244, which is inserted into the aperture 240, is bent.

As shown in FIG. 1 and FIG. 2, since the apertures 140 and 240 of the main boards 134 and 234 take various forms, the main boards 134 and 234 can be easily mounted to an external device of any type. Accordingly, in the optic semiconductor modules 100 and 200 and according to the present invention, an electrical signal is transmitted to the laser diode 124 through the board metal patterns 138 and 238 of the main boards 134 and 234, the substrate metal patterns 112 of the cap type substrate 118 of the semiconductor package portion 191, and the conductive wires 122. Then, the laser diode 124 converts the electric signal to a corresponding optical signal to be outputted in the outside area, that is, the optical signal of the laser diode 124 is transmitted through the glass 130 to the core of the optical fiber 144 and 244.

An optical signal received from the optical fiber 144 and 244 is transmitted through the glass 130 of the package portion 191 to a photo detector 126 used for detecting it, and then is converted to a corresponding electric signal. The converted electric signal is transmitted to the external device via the conductive wires 122, the substrate metal pattern 112 of the cap type substrate 118 and the board metal patterns 138 and 238 of the main boards 134 and 234.

Therefore, in the optic semiconductor modules 100 and 200 according to the present invention, the cap type substrate 118 is inserted and fixed to the main boards 134 and 234, and the optical fibers 144 and 244 are completely fixed to the main boards 134 and 234, so that the rate of tilt or the change of the position between the laser diode 124 and the photo detector 126 attached to the cap type substrate 118 and the optical fibers 144 and 244 is remarkably decreased. Also, the wave-guide (not shown) between the optical element and the core of the optical fiber are aligned in a straight line, so that the optical coupling efficiency is increased.

Furthermore, the present invention employs the cap type substrate 118 instead of the metal cap used in the prior art. In addition, the cap type substrate 118 is inserted into depression portions 136 and 236 and fixed to the main boards 134 and 234, thereby sharply decreasing the thickness of the entire package.

Figure 3:
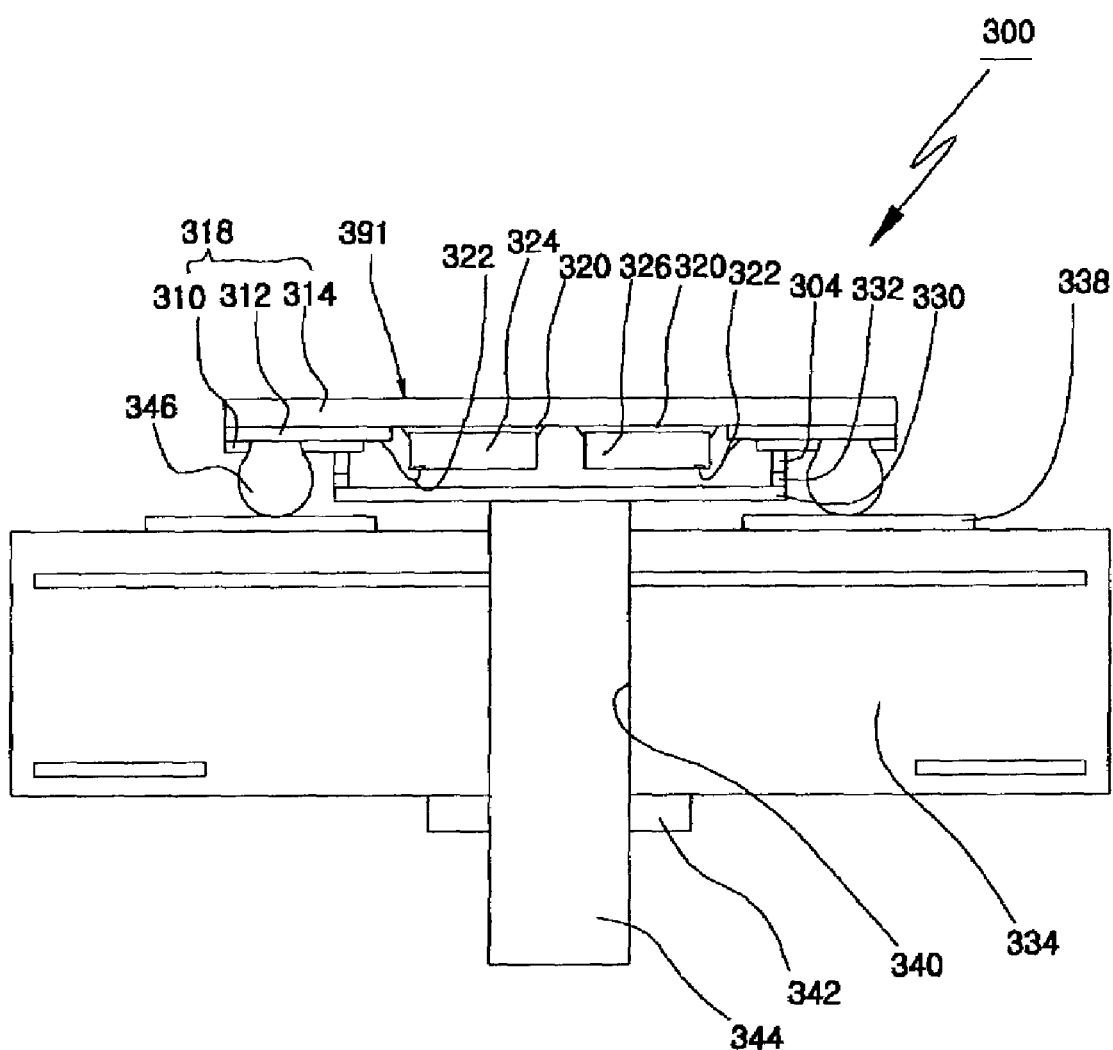
FIG. 3 is a sectional view illustrating an alternative embodiment of the present invention.

Referring to FIG. 3, a sectional view of alternative embodiments of an optic semiconductor module 300 according to the present invention is illustrated. The optic semiconductor module 300 also comprises a semiconductor package portion 391, a main board 334 and an optical fiber 344 or the like.

The package portion 391 comprises a substrate 318 having a resin layer 314 of an approximately planar plate shape and a plurality of substrate metal patterns 312 formed at a bottom surface of the resin layer 314. The substrate 318 further includes an insulative layer 310 applied to a surface of the substrate metal patterns 312. A laser diode 324 and a photo detector 326 are attached to the bottom surface of the center of the resin layer 314 of the substrate 318 by means of an attach material 320 and are electrically connected to the electrically conductive substrate metal patterns 312 by means of conductive wires 322, respectively. A dam 304 of a predetermined thickness is coupled over the surface of the insulative layer 310, which is located at the periphery of the laser diode 324 and the photo detector 326. A glass 330 is attached to the dam 304 by applying a glass attach material 332 between them. In the meantime, a plurality of conductive balls 346 are fused to the substrate metal patterns 312 of the substrate 318. Also, the conductive balls 346 are fused to a plurality of board metal patterns 338 of the main board 334.

An aperture 340 of a prescribed diameter is formed at the main board 334 adjacent to the glass 330. The optical fiber 344 is coupled to the main board 334 at the aperture 340. Furthermore, a fixer 342 is formed on the bottom surface of the main board 334 in order that the optical fiber 344 is completely fixed to the aperture 340.

Figure 4:
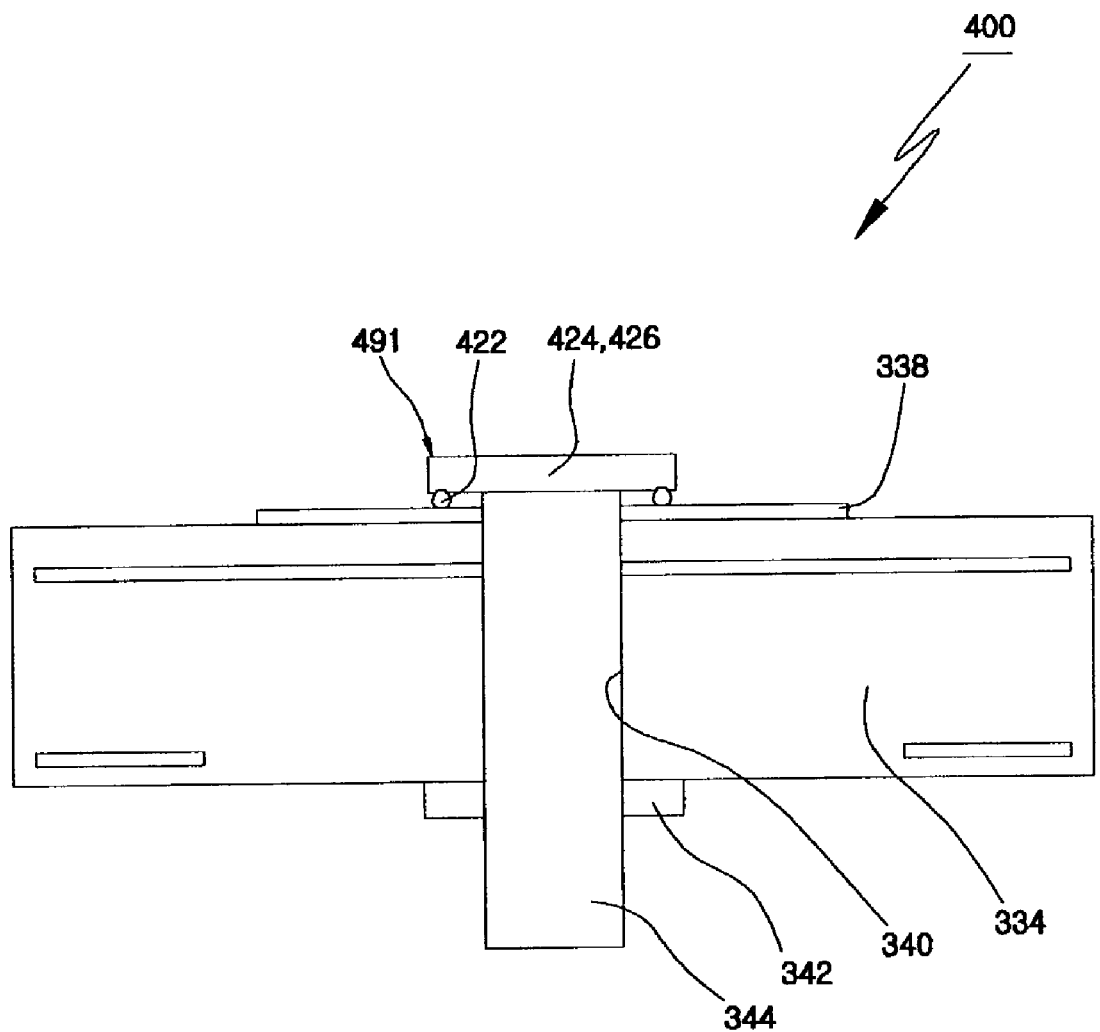
FIG. 4 is a sectional view illustrating another alternative embodiment of the present invention.

Referring to FIG. 4, a sectional view of another alternative embodiment of an optic semiconductor module 400 according to the present invention is illustrated. The optic semiconductor module 400 as shown in FIG. 4 is similar to the optical semiconductor module 300 of FIG. 3 in terms of the main board, the optical fiber, and their connecting structure. Only a package portion 491 of the optic semiconductor module 400 is different from that of the optical semiconductor module 300 of FIG. 3.

In the package portion 491, a plurality of conductive bumps 422 are directly fused to a laser diode 424 or a photo detector 426. Also, the conductive bumps 422 are directly connected to the board metal patterns 338 of the main board 334. The active region of the laser diode 424 or the photo detector 426 faces the optical fiber 344 which is inserted into the aperture 340.

Figure 5:
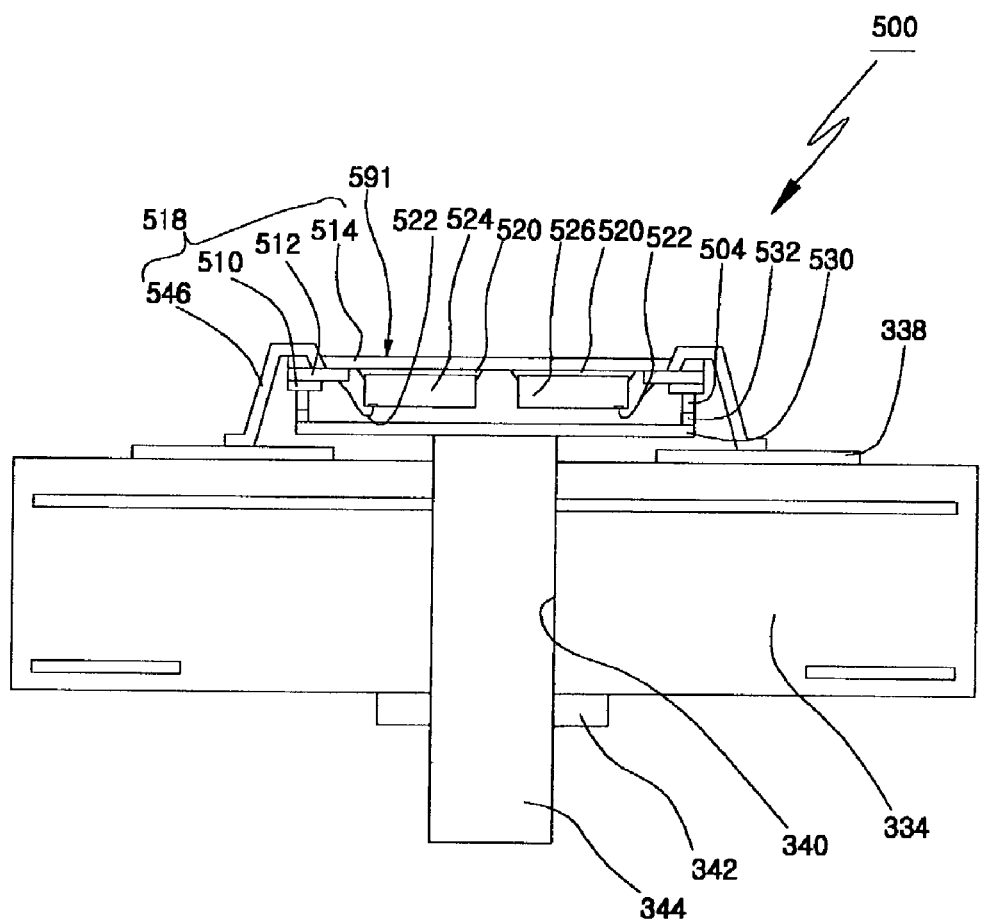
FIG. 5 is a sectional view illustrating another alternative embodiment of the present invention; and FIG. 6A through FIG. 6F is a series of diagrams used for explaining the process flow for a method for manufacturing one embodiment of the present invention.

Referring to FIG. 5, a sectional view of another alternative embodiment of an optic semiconductor module 500 according to the present invention is illustrated. The optic semiconductor module 500 as shown in FIG. 5 is similar to the optical semiconductor module 300 of FIG. 3 in terms of the main board, the optical fiber, and their connecting structure. Only a package portion 591 of the optic semiconductor module 500 is different from that of the optical semiconductor module 300 of FIG. 3.

The package portion 591 comprises: a substrate 518; a laser diode 524; a photo detector 526; a plurality of conductive wires 522; and a glass 530 or the like. The substrate 518 includes a resin layer 514 of an approximately planar plate shape, a plurality of substrate metal patterns 512 formed at an edge of the bottom surface of the resin layer 514, and an insulative layer 510 applied on the surface of the substrate metal pattern 512. A plurality of leads 546 passing through the resin layer 514 is connected to the substrate metal patterns 512. The lead 546 is bent in the form of an approximately S-shape. The lower end portion of the lead 546 is electrically connected to the board metal pattern 338 of the main board 334. The laser diode S24 and the photo detector 526 are attached to the bottom surface of the center of the resin layer S14 of the substrate S18 by means of an attach material 520 and are electrically connected to the electrically conductive patterns 512 by means of conductive wires S22, respectively. A dam 504 of a predetermined thickness located at the periphery of the laser diode 524 and the photo detector 526 is coupled to the surface of the insulative layer 510. The glass 530 is attached to the dam 504 by applying a glass attach material 532 between them.

The aperture 340 of a prescribed diameter is formed at the main board 334 adjacent to the glass 530. Also, the fixer 342 is formed on the bottom surface of the main board 334 such that the optical fiber 344 is completely fixed to the main board at the aperture 340.

Referring to FIG. 6A through FIG. 6F, the process flow for constructing the embodiment illustrated by FIG. 1 is discussed.

Figure 6A:
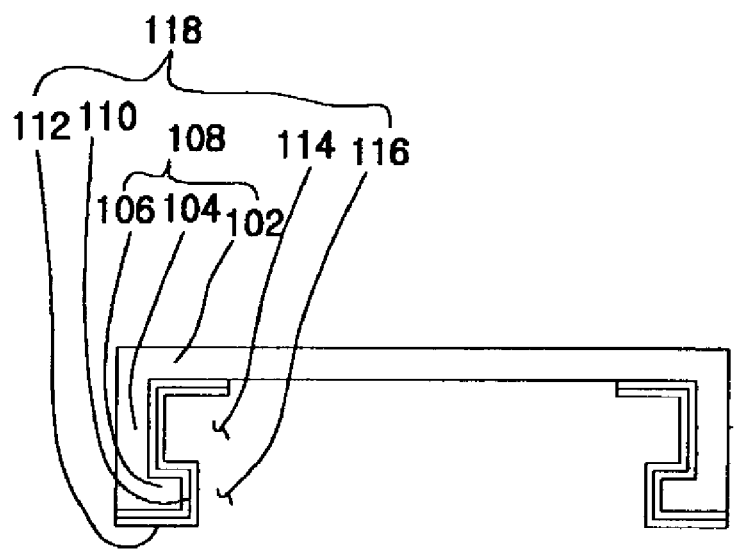

Referring to FIG. 6A, the cap type substrate 118, including the base 108 having the space 114 inside as well as the opening 116 at the lower part thereof and the substrate metal patterns 112 formed on the inside surface and the bottom surface of the base 108 by means of the adhesive layer 110 there between, is provided.

The base 108 includes the planar portion 102 of an approximately planar plate shape formed on its upper part, the vertical bending portion 104 bent vertically downward at the edge of the planar portion 102, and the horizontal bending portion 106 of the prescribed length extending horizontally from the lower part of the vertical bending portion 104 to its inside. The adhesive layer 110 is applied to a part of the inside surface of the planar portion 102, the inside surface of the vertical bend portion 104, as well as each of the inside surfaces and the bottom surface of the horizontal bending portion 106. Also, the substrate metal patterns 112 are laminated to the surface of the adhesive layer 110.

Figure 6B:
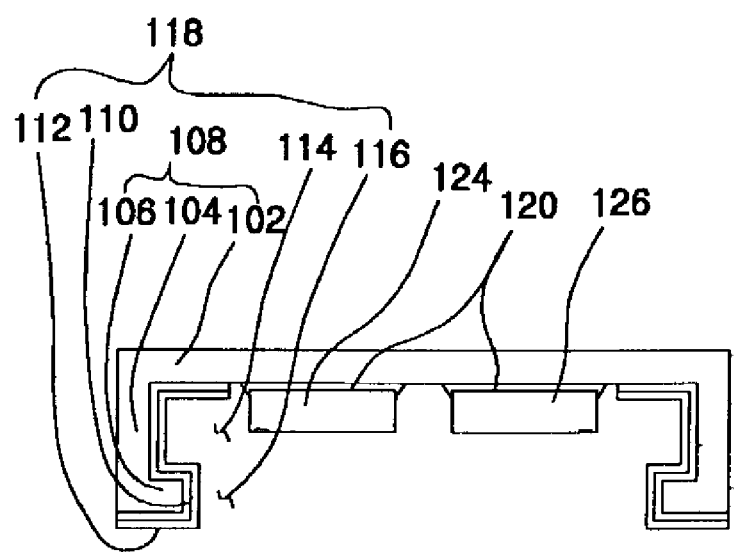

Referring to FIG. 6B, the laser diode 124 and the photo detector 126 are attached to the inside surface of the cap type substrate 118 by means of the attach material 120, that is, the laser diode 124 for converting the electrical signals into the optical signals to be outputted and the photo detector 126 for converting the optical signals into the electrical signals to be outputted are attached to the bottom surface of the planar portion 102 of the base 108 of the cap type substrate 118 by means of the attach material 120.

Figure 6C:
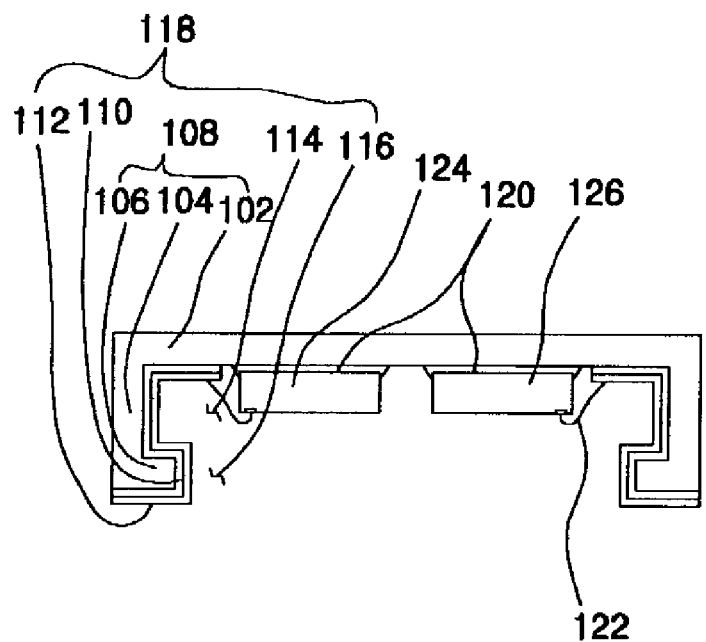

Referring to FIG. 6C, the laser diode 124 and the photo detector 126 are electrically connected to the substrate metal patterns 112 by means of the conductive wires 122.

Figure 6D:
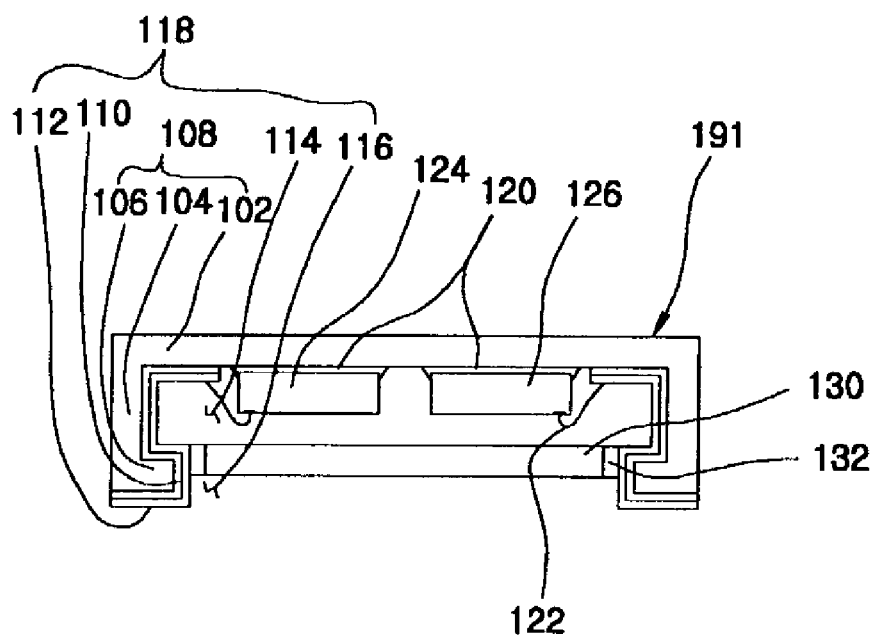
Figure 6E:
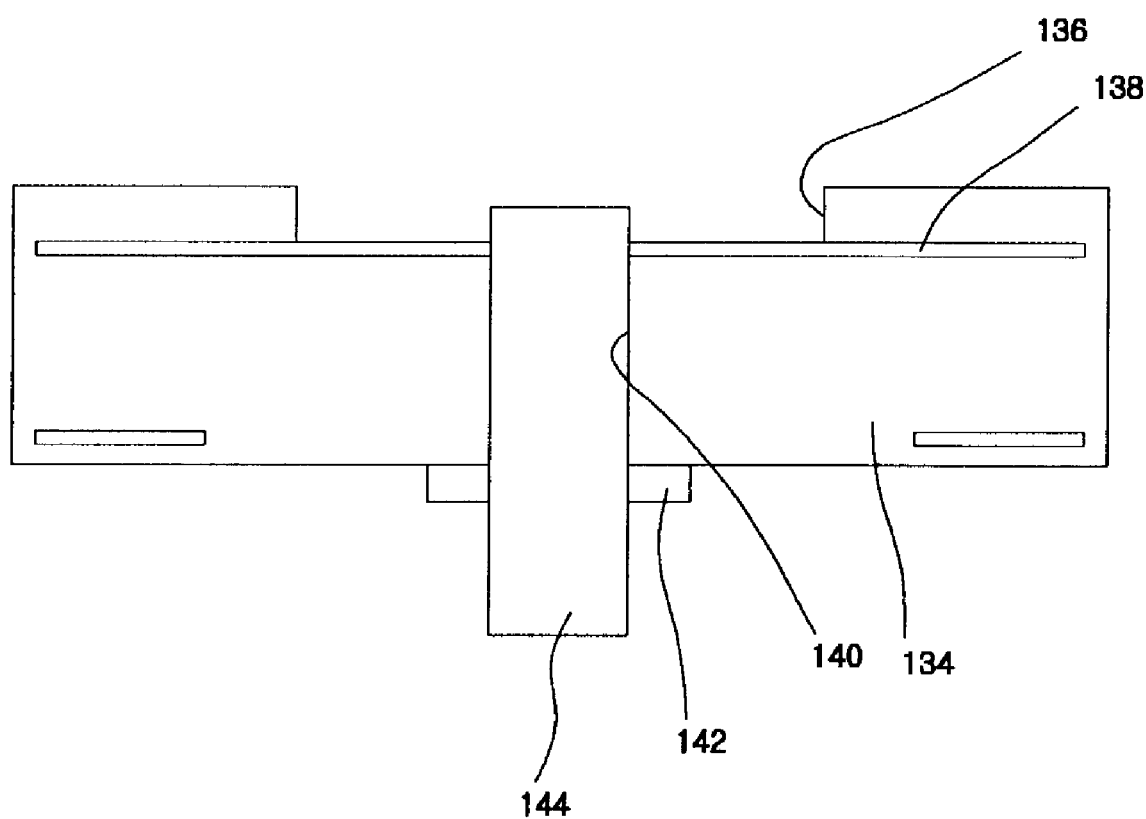

Referring to FIG. 6D, a glass 130 or a lens is placed within the opening 116 of the cap type substrate 118 and attached the end portion of the horizontal bending portion 106 by means of the glass attach material 132 between the glass 130 and the end portion of the horizontal bending portion 106, thus sealing the space 114 from the outside environment. A vacuum is formed in the space 114 of the cap type substrate 118 by removing all of the air therein, thereby minimizing the refractive index within the space 114. Together, the substrate 118, the laser diode 124, the photo detector 126, the conductive wires 122 and the glass 130 are referred to as a package portion 191. Referring to FIG. 6E, the main board 134 of an approximately planar plate shape, including the aperture 140 at the center of the main board 134 and the board metal patterns 138 formed at the periphery of the aperture 140, is provided. In an alternative embodiment, the depression portion 136, which extends into the main board a predetermined depth, can be formed at the end of the aperture 140 in order that the thickness of the package is decreased. Here, the metal patterns 138 can be formed at the broad surface of the depression portion 136. In an alternative embodiment, the optical fiber 144 can be previously coupled to the aperture 140 of the main board 134. Here, a fixer 142 can be attached to the main board 134 at the end of the aperture 140 located at the bottom surface of the main board 134 in order to fix the optical fiber 144 to the main board 134.

Figure 6F:
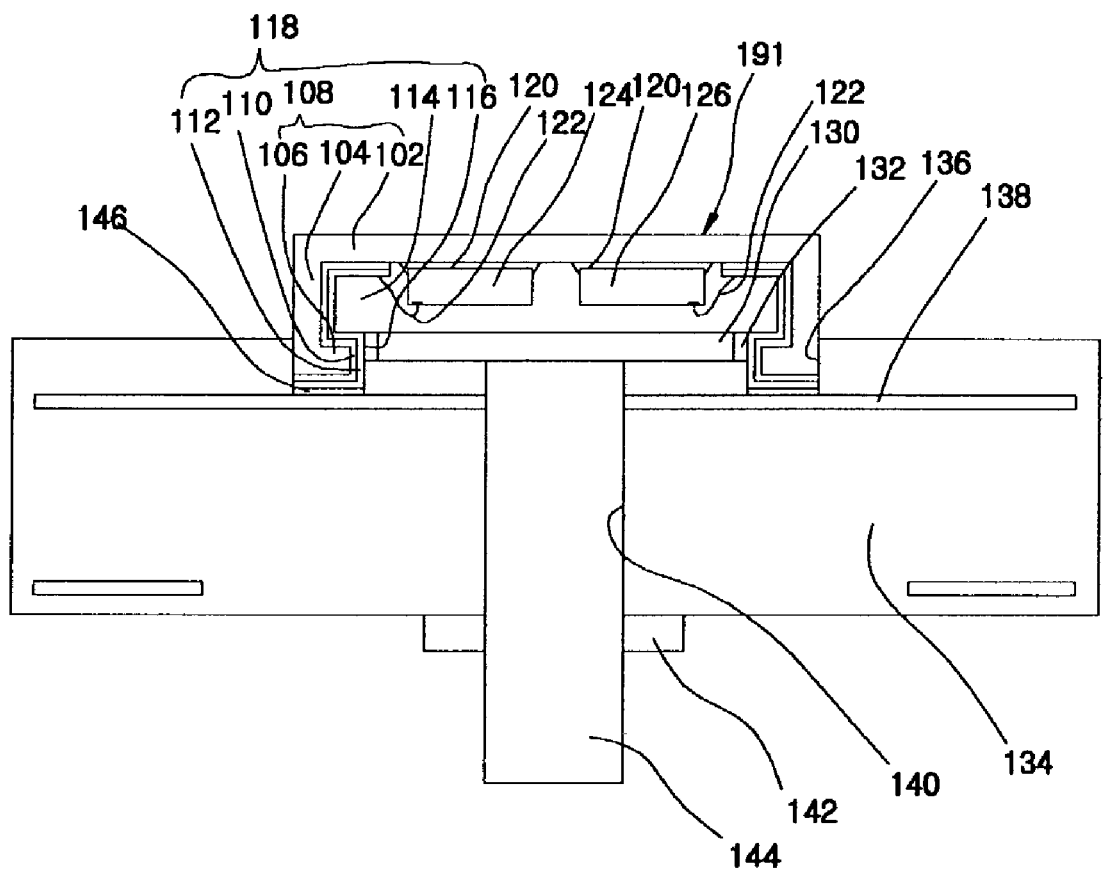

Referring to FIG. 6F, the substrate metal pattern 112 of the substrate 118 of the package portion 191 and the board metal pattern 138 of the main board 134 are connected to each other by means of a connector 146. By using, for example, a conventional solder or gold for the connector 146, the substrate metal patterns 112 of the cap type substrate 118 and the board metal patterns 138 of the main board 134 are electrically connected to each other. In an alternative embodiment, the optical fiber 144 can be coupled to the main board 134 at the aperture 140 after completion of all of the above-mentioned processes. Also, the fixer 142 can be attached to the main board 134 at the end of the aperture 140 located at the bottom surface of the main board 134 in order to fix the optical fiber 144 to the main board 134.

This disclosure provides exemplary embodiments of the present invention The scope of the present invention is not limited by these exemplary embodiments. Numerous variations, whether explicitly provided for or implied by the specification, such as variations in structure, dimension, type of material and manufacturing process may be implemented by one who is skilled in the art in view of this disclosure.

What is claimed is:

1. An optic semiconductor module comprising:
   a main board of an approximately planar plate shape having an aperture therethrough and a plurality of board metal patterns formed at a periphery of the aperture;
   a package portion coupled to the main board, the package portion comprising:
      a laser diode for converting an electric signal to an optical signal;
      a photo detector for converting an optical signal to an electric signal, wherein the laser diode and the photo detector are electrically coupled to the main board through the board metal patterns;
      a cap type substrate comprising:
         a base having inside surfaces defining a space within the base and defining an opening at a lower part of the base;
         a plurality of substrate metal patterns formed on first portions of the inside surfaces and an outside surface of the base; and
         an adhesive layer interposed between the substrate metal patterns and the first portions of the inside surfaces and the outside surface of the base, wherein the laser diode and the photo detector are bonded to a second portion of the inside surfaces of the base;
      a plurality of conductive wires electrically connecting the laser diode and photo detector to the substrate metal patterns;
      a glass attached to a perimeter edge of the opening; and
      a glass attach material interposed between the glass and the perimeter edge of the opening, wherein the glass and the glass attach material seal the opening; and
   an optical fiber inserted into the aperture of the main board, an end of the optical fiber being disposed adjacent to the package portion.

2. The optic semiconductor module as claimed in claim 1, wherein the base of the cap type substrate further comprises:
   a planar portion of an approximately planar plate shape formed at an upper part of the base;
   a vertical bending portion bent vertically downward at an edge of the planar portion; and
   a horizontal bending portion of a prescribed length extending horizontally from a lower part of the vertical bending portion toward the space; and
   wherein the substrate metal patterns are formed on inside surfaces of the planar portion, the vertical bending portion, the horizontal bending portion and the outside surface of the horizontal bending portion.

3. The optic semiconductor module as claimed in claim 1, wherein the base is formed using a material selected from the group consisting of metal, ceramic, and thermosetting resin.

4. The optic semiconductor module as claimed in claim 1, wherein the aperture of the main board extends in a straight line through the main board from a top surface of the main board to a bottom surface of the main board, and further comprising:
   a fixer attached to the main board at an end of the aperture located at the bottom surface of the main board wherein the fixer attaches the optical fiber to the main board.

5. The optic semiconductor module as claimed in claim 1, wherein the aperture of the main board bends between a top surface of the main board to a side surface of the main board, and further comprising:
   a fixer attached to the main board at an end of the aperture located at a side surface of the main board wherein the fixer attaches the optical fiber to the main board.

6. The optic semiconductor module as claimed in claim 1, wherein the main board further comprises:
   a depression portion formed at the periphery of the aperture and extending within the main board a predetermined depth from the top surface of the main board, wherein the cap type substrate is coupled with the depression portion;
   wherein the plurality of the board metal patterns is formed at a surface of the depression portion; and
   wherein the substrate metal patterns are electrically connected to the board metal patterns.

7. The optic semiconductor module as claimed in claim 1, wherein the package portion further comprises a plurality of conductive bumps electrically and mechanically fused to the laser diode and the photo detector.

8. An optic semiconductor module comprising:
   a main board of an approximately planar plate shape having an aperture therethrough and a plurality of board metal patterns formed at a periphery of the aperture;
   a package portion coupled to the main board, the package portion comprising:
      a laser diode for converting an electric signal to an optical signal;
      a photo detector for converting an optical signal to an electric signal, wherein the laser diode and the photo detector are electrically coupled to the main board through the board metal patterns;
      a substrate having a resin layer of an approximately planar plate shape, wherein the laser diode and the photo detector are attached to a bottom surface of the substrate;
      a plurality of substrate metal patterns formed at a bottom surface of the resin layer;

a plurality of conductive wires electrically connecting the laser diode and photo detector to the substrate metal patterns;
an insulative layer applied to a surface of the substrate metal patterns;
a dam of a predetermined thickness coupled to a surface of the insulative layer;
a glass attached to the dam; and
a glass attach material between the glass and the dam, wherein the glass attach material, the glass, and the substrate seal the laser diode and the photo detector from an external environment; and
an optical fiber inserted into the aperture of the main board, an end of the optical fiber being disposed adjacent to the package portion.

9. An optic semiconductor module comprising:
a main board of an approximately planar plate shape having an aperture therethrough and a plurality of board metal patterns formed at a periphery of the aperture;
a package portion coupled to the main board, the package portion comprising:
  a laser diode for converting an electric signal to an optical signal;
  a photo detector for converting an optical signal to an electric signal, wherein the laser diode and the photo detector are electrically coupled to the main board through the board metal patterns;
  a substrate comprising a resin layer of an approximately planar plate, wherein the laser diode and the photo detector are bonded to a bottom surface of the substrate;
  a plurality of substrate metal patterns formed at a bottom surface of the resin layer;
  a plurality of leads having first end portions and second end portions, the first end portions passing through the resin layer and being electrically connected to the substrate metal patterns, the second end portions being bent downward from the respective first end portions of the leads;
  a plurality of conductive wires electrically connecting the laser diode and photo detector to the substrate metal patterns;
  an insulative layer applied to a surface of the substrate metal patterns;
  a dam of a predetermined thickness formed at a surface of the insulative layer;
  a glass attached to the dam; and
  a glass attach material interposed between the glass and the dam, wherein the glass attach material, the glass, and the substrate seal the laser diode and the photo detector from an external environment; and
an optical fiber inserted into the aperture of the main board, an end of the optical fiber being disposed adjacent to the package portion.

10. A method of manufacturing an optic semiconductor module, the method comprising:
providing a cap type substrate comprising a base having inside surfaces defining a space within the base and defining an opening at the lower part of the base;
forming a plurality of substrate metal patterns;
forming an adhesive layer on first portions of the inside surfaces and an outside surface of the base;
attaching the plurality of substrate metal patterns to the first portions of the inside surfaces and the outside surface of the base by means of the adhesive layer;
bonding a laser diode and a photo detector to a second portion of the inside surfaces of the base;
connecting the laser diode and the photo detector to the plurality of substrate metal patterns by means of conductive wires;
positioning a glass within the opening in the lower part of the base;
attaching the glass to a perimeter edge of the opening by means of a glass attach material;
providing a main board of an approximately planar plate shape, the main board having an aperture therethrough and a plurality of board metal patterns formed at a periphery of the aperture; and
electrically connecting the substrate metal patterns of the cap type substrate to the board metal patterns of the main board.

11. The method of manufacturing an optic semiconductor module as claimed in claim 10 further comprising:
providing an optical fiber;
inserting the optical fiber into the aperture; and
attaching the fiber to the main board.

12. The method of manufacturing an optic semiconductor module as claimed in claim 10 further comprising:
providing an optical fiber;
coupling the optical fiber to the aperture; and
attaching the fiber to the main board by a fixing means attached to the main board at an end of the aperture located at the bottom surface of the main board.

13. An optic semiconductor module comprising:
a main board having an aperture therethrough and a plurality of board metal patterns formed at a periphery of the aperture;
a package portion coupled to the main board, wherein the package portion comprises:
  a cap type substrate comprising:
    a base having inside surfaces defining a space within the base and defining an opening at a lower part of the base;
    a plurality of substrate metal patterns formed on first portions of the inside surfaces and an outside surface of the base; and
    an adhesive layer interposed between the substrate metal patterns and the first portions of the inside surfaces and the outside surface of the base;
  a laser diode bonded to the package portion;
  a photo detector bonded to the package portion;
  wherein the laser diode and the photo detector are electrically coupled to the main board through the board metal patterns;
  a glass attached to a perimeter edge of the opening; and
  a glass attach material interposed between the glass and the perimeter edge of the opening, wherein the glass and the glass attach material seal the opening.

14. The optic semiconductor module as claimed in claim 13 further comprising:
a plurality of conductive wires electrically connecting the laser diode and photo detector to the substrate metal patterns; and
wherein the laser diode and the photo detector are bonded to a second portion of the inside surfaces of the base.

15. The optic semiconductor module as claimed in claim 13 wherein the space within the base is in a vacuum state.

16. An optic semiconductor module comprising:
a main board having an aperture therethrough and a plurality of board metal patterns formed at a periphery of the aperture;

a package portion coupled to the main board, wherein the package portion comprises:

a cap type substrate comprising:

a base having inside surfaces defining a space within the base and defining an opening at a lower part of the base;

a plurality of substrate metal patterns formed on first portions of the inside surfaces and an outside surface of the base; and an adhesive layer interposed between the substrate metal patterns and the first portions of the inside surfaces and the outside surface of the base;

a laser diode bonded to the package portion;

a photo detector bonded to the package portion; and wherein the laser diode and the photo detector are electrically coupled to the main board through the board metal patterns, wherein the main board further comprises:

a depression portion formed at the periphery of the aperture and extending within the main board a predetermined depth from the top surface of the main board, wherein the cap type substrate is coupled with the depression portion;

wherein the plurality of the board metal patterns is formed at a surface of the depression portion; and wherein the substrate metal patterns are electrically connected to the board metal patterns.

17. An optic semiconductor module comprising:

a main board having an aperture therethrough and a plurality of board metal patterns formed at a periphery of the aperture;

a package portion coupled to the main board;

a laser diode bonded to the package portion;

a photo detector bonded to the package portion;

wherein the laser diode and the photo detector are electrically coupled to the main board through the board metal patterns;

a substrate having a resin layer of an approximately planar plate shape, wherein the laser diode and the photo detector are attached to a bottom surface of the substrate;

a plurality of substrate metal patterns formed at a bottom surface of the resin layer;

a plurality of conductive wires electrically connecting the laser diode and photo detector to the substrate metal patterns;

an insulative layer applied to a surface of the substrate metal patterns;

a dam of a predetermined thickness coupled to a surface of the insulative layer;

a glass attached to the dam; and a glass attach material between the glass and the dam, wherein the glass attach material, the glass, and the substrate seal the laser diode and the photo detector from an external environment.

\* \* \* \* \*